United States Patent [19]
Waldenström et al.

[11] Patent Number: 5,624,068
[45] Date of Patent: Apr. 29, 1997

[54] DIAMOND TOOLS FOR ROCK DRILLING, METAL CUTTING AND WEAR PART APPLICATIONS

[75] Inventors: Mats G. Waldenström, Bromma; Udo K. R. Fischer, Vällingby; Lars H. Hillert, Saltsjö-Boo, all of Sweden; Mahlon D. Dennis, Kingwood, Tex.

[73] Assignees: Sandvik AB, Sandviken, Sweden; Diamant Boart Stratabit S.A., Brussels, Belgium

[21] Appl. No.: 568,293

[22] Filed: Dec. 6, 1995

Related U.S. Application Data

[62] Division of Ser. No. 297,905, Aug. 29, 1994, Pat. No. 5,496,638, which is a continuation of Ser. No. 73,480, Jun. 9, 1993, abandoned, which is a continuation of Ser. No. 774,897, Oct. 11, 1991, Pat. No. 5,264,283.

Foreign Application Priority Data

Oct. 11, 1990 [SE] Sweden .................. 9003251

[51] Int. Cl.⁶ .................. B24D 18/00; B23K 20/02
[52] U.S. Cl. .................. 228/262.21; 76/108.2; 76/DIG. 12; 51/295
[58] Field of Search .................. 228/262.21; 76/DIG. 12, 76/108.2, 108.4; 51/307, 309, 295

[56] References Cited

U.S. PATENT DOCUMENTS

| | | |
|---|---|---|
| 2,138,864 | 12/1938 | Karasick . |
| 2,941,248 | 6/1960 | Hall . |
| 3,141,746 | 7/1964 | De Lai . |
| 3,757,878 | 9/1973 | Wilder et al. . |
| 3,757,879 | 9/1973 | Wilder et al. . |
| 3,909,895 | 10/1975 | Abrahamson et al. . |
| 4,109,737 | 8/1978 | Bovenkerk . |
| 4,148,368 | 4/1979 | Evans . |
| 4,150,195 | 4/1979 | Tobioka et al. . |
| 4,274,840 | 6/1981 | Housman . |
| 4,531,595 | 7/1985 | Housman . |
| 4,592,433 | 6/1986 | Dennis . |
| 4,593,776 | 6/1986 | Salesky . |
| 4,610,931 | 9/1986 | Nemeth et al. . |
| 4,694,918 | 9/1987 | Hall . |
| 4,707,384 | 11/1987 | Schachner et al. . |
| 4,718,505 | 1/1988 | Fuller . |
| 4,731,296 | 3/1988 | Kikuchi et al. . |
| 4,743,515 | 5/1988 | Fischer et al. . |
| 4,751,972 | 6/1988 | Jones et al. . |
| 4,764,434 | 8/1988 | Aronsson et al. . |
| 4,766,040 | 8/1988 | Hillert et al. . |
| 4,784,023 | 11/1988 | Dennis et al. . |
| 4,811,801 | 3/1989 | Salesky et al. . |
| 4,819,516 | 4/1989 | Dennis et al. . |
| 4,820,482 | 4/1989 | Fischer et al. . |
| 4,843,039 | 6/1989 | Akesson et al. . |
| 4,858,707 | 8/1989 | Jones et al. . |
| 4,871,377 | 10/1989 | Frushour . |
| 4,889,017 | 12/1989 | Fuller et al. . |
| 4,900,628 | 2/1990 | Ikegaya et al. . |
| 4,931,068 | 6/1990 | Dismukes . |
| 4,954,139 | 9/1990 | Cerutti . |
| 4,972,637 | 11/1990 | Dyer . |
| 5,007,207 | 4/1991 | Phaal . |
| 5,011,509 | 4/1991 | Frushour .................. 51/295 X |
| 5,020,394 | 6/1991 | Nakamuta et al. . |
| 5,074,623 | 12/1991 | Hedlund et al. . |
| 5,100,703 | 3/1992 | Saijo . |
| 5,106,392 | 4/1992 | Slutz et al. .................. 51/309 X |
| 5,217,081 | 6/1993 | Waldenström et al. .................. 175/420.2 |
| 5,225,275 | 7/1993 | Aida . |

FOREIGN PATENT DOCUMENTS

| | | |
|---|---|---|
| 272418 | 6/1988 | European Pat. Off. . |
| 327110 | 8/1989 | European Pat. Off. . |
| 2138864 | 10/1984 | United Kingdom . |

*Primary Examiner*—Kenneth J. Ramsey
*Attorney, Agent, or Firm*—Burns, Doane, Swecker & Mathis, L.L.P.

[57] ABSTRACT

The present invention relates to buttons, inserts and bodies for rock drilling, rock cutting, metal cutting and wear part applications. The buttons, inserts and bodies comprise cemented carbide provided with bodies and/or layers of CVD- or PVD-fabricated diamond and then HP/HT treated in the diamond stable area. The bodies of cemented carbide may have a uniform structure or a multi-structure containing eta-phase surrounded by a surface zone of cemented carbide free of eta-phase.

6 Claims, 4 Drawing Sheets

FIG.5A HP/HT 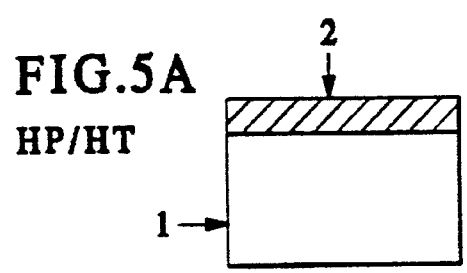
FIG.5B HP/HT 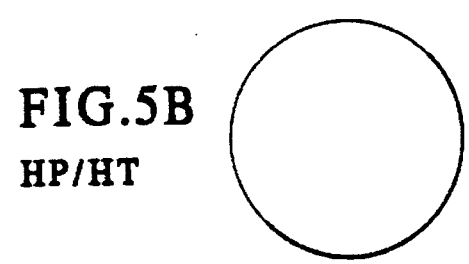
FIG.6A HP/HT 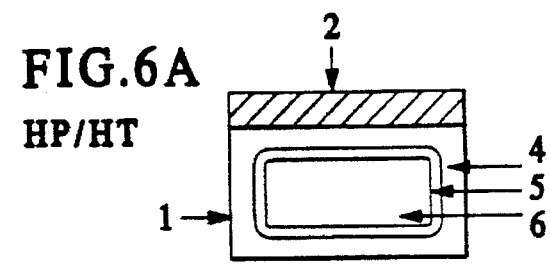
FIG.6B HP/HT 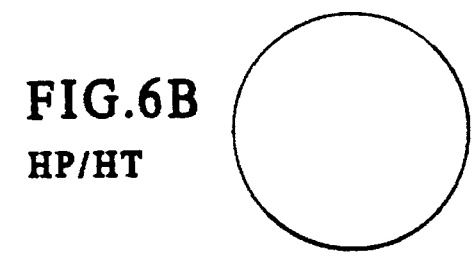

HP/HT

HP/HT

HP/HT

HP/HT

HP/HT

HP/HT

HP/HT

HP/HT

HP/HT

HP/HT

HP/HT

HP/HT

DIAMOND TOOLS FOR ROCK DRILLING, METAL CUTTING AND WEAR PART APPLICATIONS

This application is a divisional of application Ser. No. 08/297,905, filed Aug. 29, 1994, now U.S. Pat. No. 5,496,638; which is a continuation of application Ser. No. 08/073,480, filed Jun. 9, 1993, now abandoned; which is a continuation, of application Ser. No. 07/774,897, filed Oct. 11, 1991, now U.S. Pat. No. 5,264,283.

FIELD OF THE INVENTION

The present invention concerns the fields of rock drilling, metal cutting and wear part applications. More particularly, the invention relates to bit buttons for percussive and rotary crushing rock drilling, bit inserts for rock cutting, inserts for metal cutting, such as turning, milling and drilling, and bodies for various wear part applications. The buttons, inserts and bodies comprise cemented carbide provided with bodies and/or layers of CVD- or PVD-deposited diamond bonded by HP/HT (high pressure/high temperature) techniques.

BACKGROUND OF THE INVENTION

There are three main groups of rock drilling methods: percussive, rotary crushing and cutting rock drilling. In percussive and rotary crushing rock drilling, the inserts generally have a rounded shape, often a cylinder with a rounded top surface generally referred to as a button. In rotary cutting rock drilling, the inserts are provided with an edge which acts as a cutter.

The inserts for metal cutting are provided with a sharp edge which acts as a cutter. The bodies for various types of wear part applications have different non-cutting configurations. There already exists a number of such high pressure-high temperature sintered buttons, inserts and bodies of cemented carbide provided with polycrystalline diamond bodies or layers.

The technique when producing such polycrystalline diamond tools using high pressure/high temperature where diamond is the stable phase has been described in a number of patents, e.g., U.S. Pat. No. 2,941,248, "High Temperature High Pressure Apparatus", U.S. Pat. No. 3,141,746, "Diamond Compact Abrasive". High pressure bonded body having more than 50 vol % diamond and a metal binder: Co, Ni, Ti, Cr, Mn, Ta, etc. These patents disclose the use of a pressure and a temperature where diamond is the stable phase.

In some later patents, e.g., U.S. Pat. Nos. 4,764,434 and 4,766,040, high pressure-high temperature sintered polycrystalline diamond tools are described. In the first patent, the diamond layer is bonded to a support body having a complex, non-plane geometry by means of a thin layer of a refractory material applied by PVD- or CVD-technique. In the second patent, temperature resistant abrasive polycrystalline diamond bodies are described having different additions of binder metals at different distances from the working surface.

A recent development in this field is the use of one or more continuous layers of polycrystalline diamond on the top surface of the cemented carbide button. U.S. Pat. No. 4,811,801, discloses rock bit buttons including such a polycrystalline diamond surface on top of the cemented carbide buttons.

Another development is disclosed in U.S. Pat. No. 4,592,433, including a cutting blank for use on a drill bit comprising a substrate of a hard material having a cutting surface with strips of polycrystalline diamond dispersed in grooves arranged in various patterns.

U.S. Pat. No. 4,784,023, discloses a cutting element comprising a stud and a composite bonded thereto. The composite comprises a substrate formed of cemented carbide and a diamond layer bonded to a substrate. The interface between the diamond layer and the substrate is defined by alternating ridges of diamond and cemented carbide which are mutually interlocked. The top surface of the diamond body is continuous and covering the whole insert. The sides of the diamond body are not in direct contact with any cemented carbide.

U.S. Pat. No. 4,819,516, discloses a cutting element with a V-shaped diamond cutting face. The cutting element is formed from a single circular cutting blank by cutting the blank into segments joining two identical ones of the segments and truncating the joined segments. Also in this case, the surface of the diamond body is continuous and the sides are not in direct contact with any cemented carbide.

European Patent Application No. 0312281, discloses a tool insert comprising a body of cemented carbide with a layer of polycrystalline diamond and between the layer and the cemented carbide, a number of recesses filled with abrasive compact material extending into the supporting body of cemented carbide.

U.S. Pat. No. 4,871,377, discloses a composite compact including a table of diamond particles with a strong, chemically inert binder matrix and a thin metal layer bonded directly to the table in a HP/HT press.

Another development in this field is the use of cemented carbide bodies having different structures in different distances from the surface, such as disclosed in U.S. Pat. Nos. 4,743,515 and 4,843,039, where bodies of cemented carbide containing eta-phase are surrounded by a surface zone of cemented carbide free of eta-phase and having a low content of cobalt in the surface and a higher content of cobalt closer to the eta-phase zone. U.S. Pat. No. 4,820,482, discloses rock bit buttons of cemented carbide having a content of binder phase in the surface that is lower and in the center higher than the nominal content. In the center, there is a zone having a uniform content of binder phase. The tungsten carbide grain size is uniform throughout the body.

OBJECT OF THE INVENTION

An object of the invention is to provide diamond tools for rock drilling, metal cutting and wear part applications having buttons, inserts or bodies of cemented carbide provided with diamond bodies and/or layers with high and uniform compression of the diamond by sintering the diamond and the cemented carbide together at high pressure and high temperature in the diamond stable area. The diamond bodies and/or layers are fabricated by CVD- or PVD-technique before the HP/HT treatment.

It is a further object of the invention to make it possible to maximize the strength of the diamond to resist cracking, chipping and wear.

SUMMARY OF THE INVENTION

In one aspect of the invention, there is provided a composite body for rock drilling, rock cutting, metal cutting or wear part applications comprising a diamond portion bonded to a cemented carbide substrate wherein said diamond portion is prefabricated by a CVD- or PVD-technique and bonded to the cemented carbide substrate by high pressure and high temperature.

In another aspect of the invention, there is provided a method of making a composite body for rock drilling, metal cutting and wear part applications comprising prefabricating a diamond portion by CVD- or PVD-technique, prefabricating a cemented carbide portion, and bonding the diamond portion and cemented carbide portion by high pressure and high temperature.

BRIEF DESCRIPTION OF THE DRAWINGS

The invention will be described with reference to the accompanying drawings in which 1=cemented carbide button or insert 2=diamond coating directly deposited by CVD- or PVD-technique 3=prefabricated diamond body made by CVD- or PVD-technique 4=cemented carbide: Co-poor zone 5=cemented carbide: Co-rich zone 6=cemented carbide: eta-phase containing core 7=brazing metal or alloy

FIG. 5 shows an insert similar to FIG. 1, where the insert has been HP/HT treated according to the invention.

FIG. 6 shows a cemented carbide insert similar to FIG. 2, where the insert has been HP/HT treated according to the invention.

DETAILED DESCRIPTION OF THE PREFERRED EMBODIMENTS OF THE INVENTION

Figure 1A:
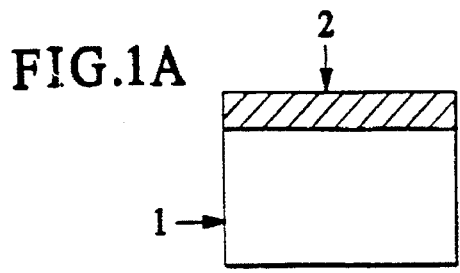
FIG. 1 shows a cemented carbide insert having a layer of directly deposited CVD-diamond (prior art).

According to the present invention, there are provided buttons, inserts and bodies for rock drilling, metal cutting and wear part applications comprising a body of cemented carbide with conventional uniform structure or having a multi-structure according to U.S. Pat. No. 4,743,515. The cemented carbide body is provided with one or more bodies and/or one or more layers of diamond that are fabricated by CVD-or PVD-technique and then attached or bonded to the cemented carbide body by the HP/HT technique. The bodies and layers of diamond can be prefabricated in two different ways, either directly on the cemented carbide body or separate from that body.

The separately prefabricated bodies and/or layers of CVD- or PVD-diamond are placed into holes in the cemented carbide or attached to the surface before the HP/HT treatment in the diamond stable area. The HP/HT treatment gives a favorable stress distribution, i.e., a high and uniform compression of the diamond caused by the difference in thermal expansion between the cemented carbide and the diamond. Furthermore, the HP/HT treatment gives a strong binding between the cemented carbide and the diamond and a healing of small defects like cracks in the CVD- PVD-diamond as well as a transformation of graphite residues into the diamond.

A number of different combinations may also be used between various bodies and layer of CVD- or PVD-made diamond and between these and conventional types of HP/HT-sintered diamond, e.g.:

untreated CVD- or PVD-layer on top of HP/HT treated CVD- or PVD-layer;

HP/HT treated CVD- or PVD-layer on a substrate that has been provided with a thin layer of TiN or other material that can prevent the migration of binder metal like Co;

HP/HT treated CVD- or PVD-body or—layer on top of a body or layer of conventional HP/HT-sintered diamond;

HP/HT treated CVD- or PVD-body or—layer between bodies or layers of conventional HP/HT-sintered diamond.

The buttons, inserts and bodies above can be adapted to different applications by changing the material properties and geometries of the cemented carbide and the diamond, especially hardness, elasticity and thermal expansion, giving different wear resistance and impact strength. The height of the bodies and thickness of the layers of diamond shall be 5 micrometer-2 mm, preferably 50 micrometer-1 mm.

The cemented carbide grade shall be chosen with respect to the application, i.e., rock drilling, rock cutting, metal cutting or wear part applications. It is important to chose a grade which has a suitable wear resistance compared to that of the diamond body or layer. The binder phase content shall be 3–35 weight %, preferably 5–12 weight %, and the grain size of the cemented carbide at least 1 micrometer preferably 2–6 micrometer.

The cemented carbide shall have a uniform structure or a multi-structure according to U.S. Pat. No. 4,743,515, having a core containing eta-phase surrounded by a surface zone of cemented carbide free of eta-phase. The size of this core shall be 10–95%, preferably 30–65%, of the total amount of cemented carbide in the button or insert. The core should contain at least 2% by volume, preferably at least 10% by volume of eta-phase but at most 60% by volume, preferably at the most 35% by volume.

In the zone free of eta-phase, the content of the binder phase, i.e., in general, the content of cobalt, shall in the surface be 0.1–0.9, preferably 0.2–0.7, the nominal content of binder phase and the binder phase shall increase in the direction towards the core up to a maximum of at least 1.2, preferably 1.4–2.5, the nominal content of binder phase. For metal cutting applications, the zone free of eta-phase shall be less than 1 mm, preferably less than 300 micrometer thick. The width of the zone poor of binder phase shall be 5–100 micrometer. For other applications, the width of the zone poor of binder phase shall be 0.2–0.8, preferably 0.3–0.7, the width of the zone free of eta-phase, but at least 0.4 mm and preferably at least 0.8 mm in width.

The bodies of polycrystalline diamond may extend a shorter or longer distance into the cemented carbide body and the diamond body may be in contact with all three described zones, preferably in contact only with the cobalt poor zone.

The cemented carbide buttons, inserts and bodies are manufactured by powder metallurgical methods according to U.S. Pat. No. 4,743,515. The holes for the bodies of CVD- or PVD-diamond are preferably made before the sintering either in a separate operation or by compacting in a specially designed tool. After sintering of the cemented carbide, the bodies or layers of diamond are put in the holes or on the surface of the cemented carbide body and HP/HT treated, normally in the diamond stable area, i.e., at high pressure, more than 3.5 GPa, preferably 6–7 GPa, and at a temperature of more than 1100° C., preferably 1700° C., for 1–30 minutes, preferably about 3 minutes. In some cases, the treatment can be done at lower pressures and temperatures such as more than 0.02 GPa and more than 500° C. After the HP/HT treatment, the buttons, inserts and bodies are blasted and ground to final shape and dimension.

The invention has been described with reference to conventional cemented carbide. It is obvious, especially for metal cutting, that the cemented carbide may contain, in addition, so-called gamma-phase. The invention also applies to so-called cermets, i.e., titanium carbonitride based alloys and ceramic materials such as white ceramics, black ceramics and sialons.

Figure 1B:
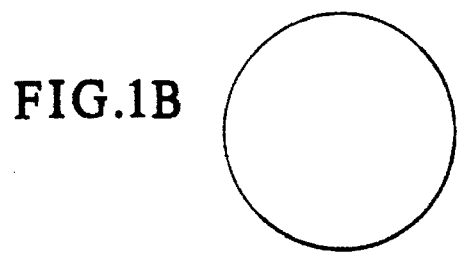
Figure 2A:
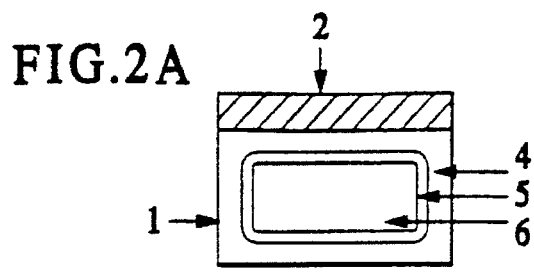
FIG. 2 shows a cemented carbide insert having the same type of layer of diamond as in FIG. 1, but with the cemented carbide containing eta-phase surrounded by a surface zone of cemented carbide free of eta-phase (prior art).
Figure 2B:
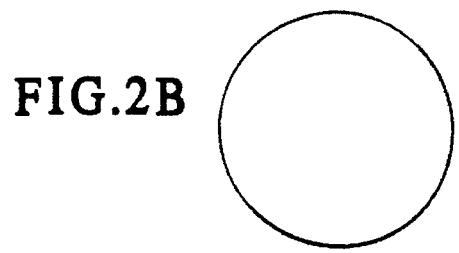
Figure 3A:
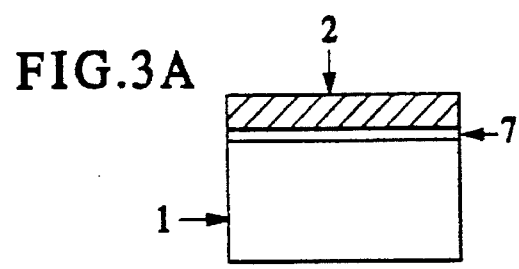
FIG. 3 shows a cemented carbide insert similar to FIG. 1, but with a layer of brazing alloy between the CVD-diamond and the cemented carbide (prior art).
Figure 3B:
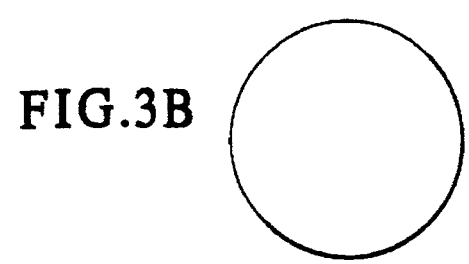
Figure 4A:
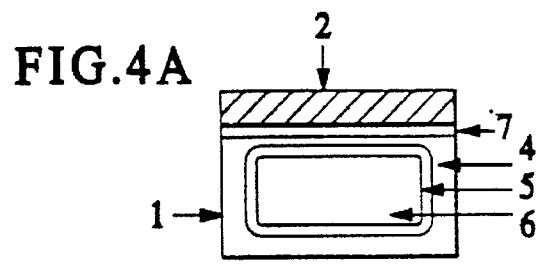
FIG. 4 shows a cemented carbide insert similar to FIG. 3, but with the cemented carbide containing eta-phase surrounded by a surface zone of cemented carbide free of eta-phase.
Figure 4B:
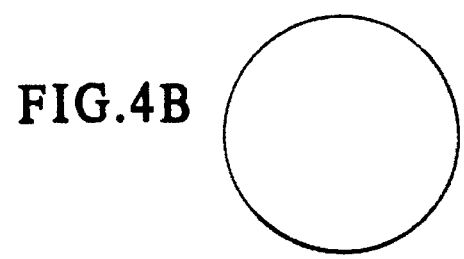
Figure 7A:
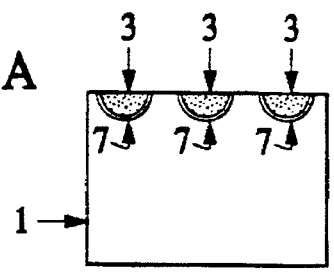
FIG. 7 shows an insert provided with a number of separately fabricated bodies of CVD-diamond that have been placed into prefabricated holes in the cemented carbide and brazed.
Figure 7B:
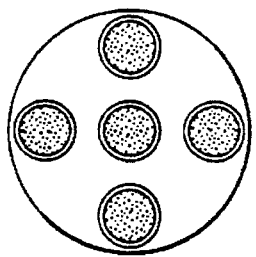
Figure 8A:
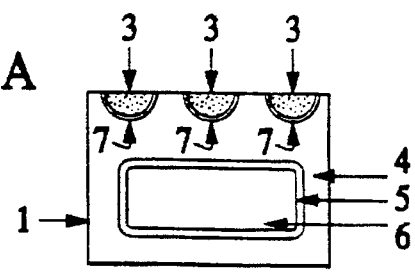
FIG. 8 shows a cemented carbide insert similar to FIG. 7, with the cemented carbide containing eta-phase surrounded by a surface zone of cemented carbide free of eta-phase.
Figure 8B:
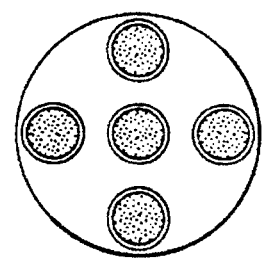
Figure 9A:
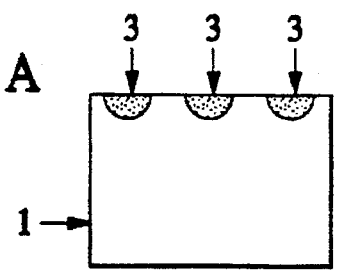
FIG. 9 shows an insert similar to FIG. 7, without any brazing. Instead, the insert has been HP/HT treated according to the invention.
Figure 9B:
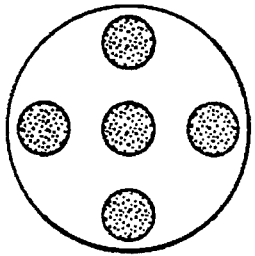
Figure 10A:
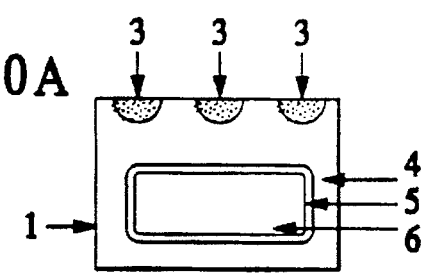
FIG. 10 shows a cemented carbide insert similar to FIG. 9, with the cemented carbide containing eta-phase surrounded by a surface zone of cemented carbide free of eta-phase according to the invention.
Figure 10B:
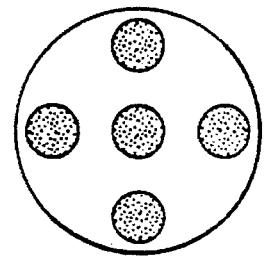
Figure 11A:
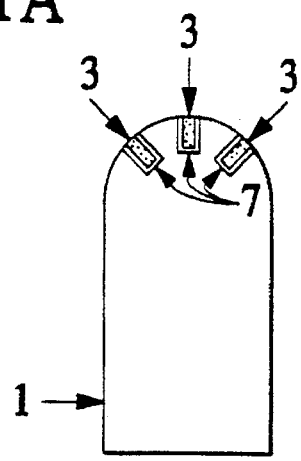
FIG. 11 shows a cemented carbide button provided with a number of separately fabricated bodies of CVD-diamond that have been placed into prefabricated holes in the cemented carbide and brazed.
Figure 12A:
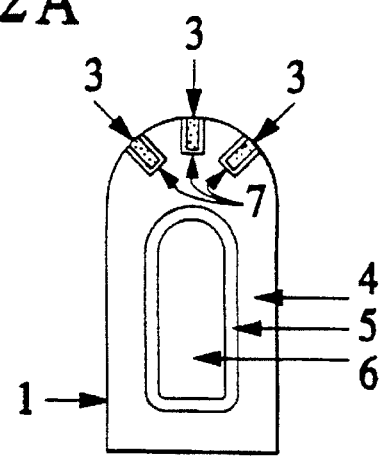
FIG. 12 shows a cemented carbide button similar to FIG. 11, with the cemented carbide containing eta-phase surrounded by a surface zone of cemented carbide free of eta-phase.
Figure 11B:
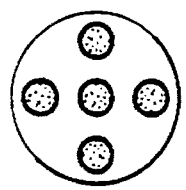
Figure 12B:
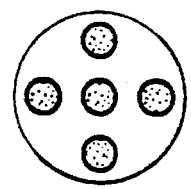
Figure 13A:
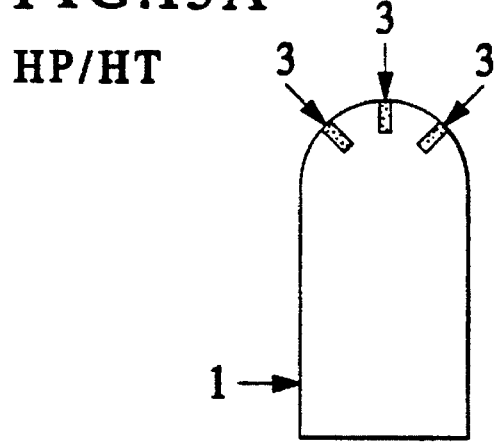
FIG. 13 shows a cemented carbide button provided with a number of separately fabricated bodies of CVD-diamond that have been placed into prefabricated holes in the cemented carbide and then HP/HT treated according to the invention.
Figure 14A:
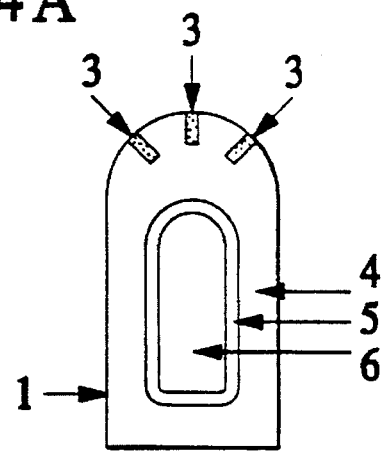
FIG. 14 shows a cemented carbide button similar to FIG. 13, but with the cemented carbide containing eta-phase surrounded by a surface zone of cemented carbide free of eta-phase according to the invention.
Figure 13B:
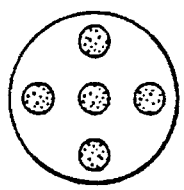
Figure 14B:
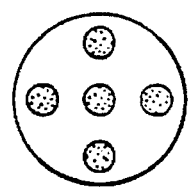

Hammer impact tests of inserts of the type according to FIG. 1 with a substrate of cemented carbide and a top layer of directly deposited CVD-fabricated diamond revealed a strong tendency of chipping off after a small number of blows. The same happened when a brazing alloy was used between the substrate and the CVD-diamond according to FIG. 3. After using a HP/HT treatment according to FIG. 5, the directly deposited CVD-diamond was surprisingly found to resist more blows and if the cemented carbide at the same time had a multi-structure according to U.S. Pat. No. 4,743,515, the layer of CVD-diamond appeared to be still much stronger (FIG. 6). A similar improvement was achieved for buttons according to FIGS. 15, 17 and 18.

The explanation of this effect, the increase of the resistance against chipping, might be a favorable stress pattern caused by the difference between the thermal expansion of the diamond layer and the cemented carbide body giving the layer a high and uniform compressive prestress. Another contributing effect might be the improvement of the binding between the cemented carbide and the CVD-diamond caused by the HP/HT treatment.

Still another effect is the healing of small defects, e.g., cracks, in the CVD- or PVD-diamond body and the transformation of graphite residues into diamond.

The invention is additionally illustrated in connection with the following Examples which are to be considered as illustrative of the present invention. It should be understood, however, that the invention is not limited to the specific details of the Examples.

EXAMPLE 1

A hammer impact test was made using a modified Charpy pendulum and cemented carbide inserts according to FIG. 1, 3, 5 and 6 having layers of directly deposited CVD-diamond. The diamond layer had a thickness of 0.7 mm. The total height of the inserts was 3.5 mm and the diameter 13.3 mm. The hammer was released from a certain height and the chipping was observed after each blow. The number of blows before chipping was taken as the measure of the shock resistance.

| RESULTS | |
| --- | --- |
| | Number of blows before chipping |
| Insert with a layer of CVD-diamond (FIG. 1) | 1 |
| Insert with a layer of CVD-diamond and a layer of brazing (FIG. 3) | 1 |
| Insert with a layer of CVD-diamond that has been HP/HT treated according to the invention (FIG. 5) | 5 |
| Insert with a layer of CVD-diamond and an eta-phase core and a HP/HT treatment according to the invention (FIG. 6) | 7 |

EXAMPLE 2

Figure 15A:
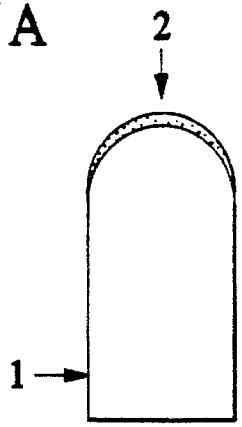
FIG. 15 shows a cemented carbide button provided with a top layer of directly deposited CVD-diamond (prior art).
Figure 16A:
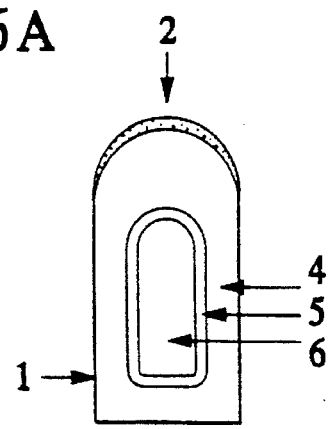
FIG. 16 shows a cemented carbide button similar to FIG. 15, with the cemented carbide containing eta-phase surrounded by a surface zone of cemented carbide free of eta-phase.
Figure 15B:
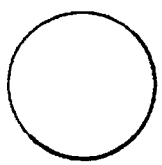
Figure 16B:
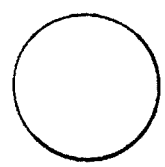
Figure 17A:
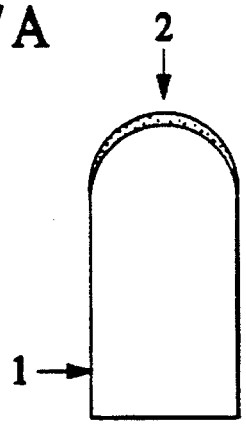
FIG. 17 shows a cemented carbide button similar to FIG. 15, where the button has been HP/HT treated according to the invention.
Figure 18A:
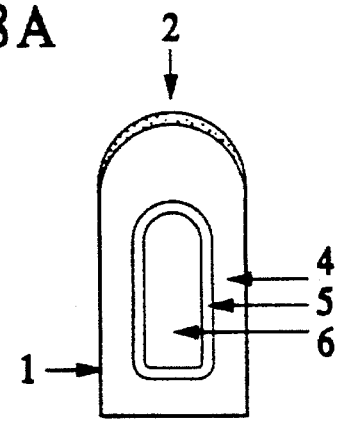
FIG. 18 shows a cemented carbide button similar to FIG. 16, where the button has been HP/HT treated according to the invention.
Figure 17B:
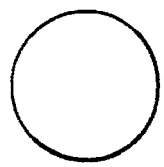
Figure 18B:
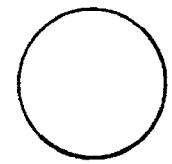

Example 1 was repeated but with cemented carbide buttons according to FIG. 15, 17 and 18, having layers of directly deposited CVD-diamond and with the hammer released from another height.

| RESULTS | |
| --- | --- |
| | Number of blows before chipping |
| Button with a layer of CVD-diamond (FIG. 15) | 1 |
| Button with a layer of CVD-diamond that has been HP/HT treated according to the invention (FIG. 17) | 4 |
| Button with a layer of CVD-diamond and an eta-phase core and a HP/HT treatment according to the invention (FIG. 18) | 6 |

EXAMPLE 3

Cemented carbide cutting tool inserts were coated with a 700 micrometer diamond layer using a high rate CVD-method, e.g., DC arc jet. The geometry of the inserts was chosen to give a tool geometry of TPUN 160308 (slightly oversized) after deposition. The inserts were then subjected to a HP/HT treatment according to the invention. The final step was a grinding/lapping treatment to ensure a smooth surface finish of the diamond layer and that the insert was within the tolerances for the TPUN 160308 geometry. Machining tests were performed in 390 alloy (Al-18%Si) to compare the performance of the inserts according to the invention with 1) inserts manufactured as above excluding the HP/HT treatment (prior art); and
2) inserts manufactured from a 700 micrometer free-standing diamond film that was brazed to the cemented carbide insert and ground to final geometry (prior art).

The cutting conditions were as follows: longitudinal turning with coolant, cutting speed 700 m/min, feed rate 0.2 mm/rev and depth of cut 1.0 mm. In all cases tool life was determined by a maximum flank wear of 0.3 mm. The tool life results were as follows:

| | |
|---|---|
| Tool according to the invention | 750 min. |
| Prior art according to 1) | 1 min. |
| Prior art according to 2) | 400 min. |

The short tool life in the case of prior art according to 1), is due to immediate flaking of the coating.

The principles, preferred embodiments and modes of operation of the present invention have been described in the foregoing specification. The invention which is intended to be protected herein, however, is not to be construed as limited to the particular forms disclosed, since these are to be regarded as illustrative rather than restrictive. Variations and changes may be made by those skilled in the art without departing from the spirit of the invention.

What is claimed is:

1. A method of making a composite body for rock drilling, metal cutting and wear part applications comprising prefabricating a diamond portion by CVD-or PVD-technique, prefabricating a cemented carbide portion, and bonding the diamond portion and cemented carbide portion by high pressure and high temperature, the diamond portion being a diamond body which is embedded in at least a part of the cemented carbide portion prior to said bonding.

2. The method of claim 1, wherein the composite body comprises a rock drilling insert.

3. The method of claim 1, wherein the composite body comprises a metal cutting insert.

4. A method of making a composite body for rock drilling, metal cutting and wear part applications comprising prefabricating a diamond portion by CVD-or PVD-technique, prefabricating a cemented carbide portion, and, bonding the diamond portion and cemented carbide portion by high pressure and high temperature, the diamond portion being formed by application onto the cemented carbide portion prior to the high pressure and high temperature treatment.

5. The method of claim 4, wherein the composite body comprises a rock drilling insert.

6. The method of claim 4, wherein the composite body comprises a metal cutting insert.

* * * * *